CONNECTOR

Filed June 7, 1966 2 Sheets-Sheet 1

INVENTORS
PAUL H. PALMATEER
KEVIN J. ROCHE

BY
ATTORNEY

Sept. 10, 1968 P. H. PALMATEER ET AL 3,401,369

CONNECTOR

Filed June 7, 1966 2 Sheets-Sheet 2

United States Patent Office 3,401,369
Patented Sept. 10, 1968

3,401,369

CONNECTOR

Paul H. Palmateer, Wappingers Falls, and Kevin J. Roche, Poughkeepsie, N.Y., assignors to International Business Machines Corporation, Armonk, N.Y., a corporation of New York Filed June 7, 1966, Ser. No. 555,729
5 Claims. (Cl. 339—17)

ABSTRACT OF THE DISCLOSURE

A laminated impedance matched connector is provided which includes a sheet of dielectric material, on one side of which a plurality of electrical contact members are formed using conventional printed circuit techniques. On the other side of the dielectric sheet, a resilient conductive ground plane is bonded. The laminate is formed into a substantially U-shaped configuration to receive the edge connectors from printed circuit boards. The distance between the electrical contact members and the resilient conductive ground plane achieves the desired impedance matching characteristic and provides a continuous transmission line characteristic from board to interconnector to board.

Figure 1:
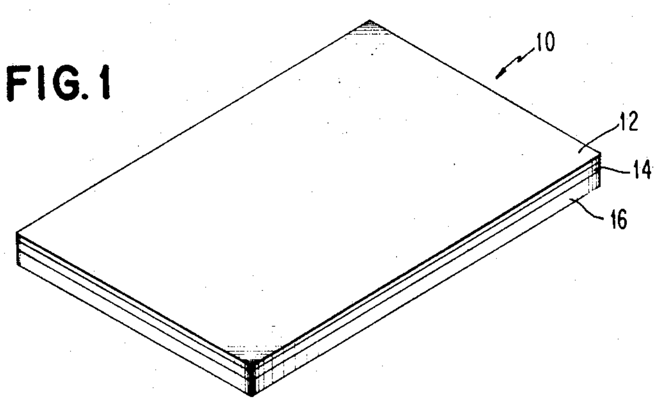

This invention relates to electrical connectors, and more particularly to electrical connectors adapted for use with printed circuit boards.

Modern data processing systems require that logic decisions be made in a matter of nanoseconds rather than milli or microseconds. In this range of decision speed, circuit designers have found that signal rise times are so fast as to require the utilization of transmission line techniques. In particular, whereas printed circuit boards were previously manufactured with no special attention to the impedance characteristics of the circuit lines, printed circuits must now be constructed with all the characteristics of transmission lines, e.g. with signal conductors placed a known preset distance from a reference ground plane and terminated to prevent reflections. While printed circuit boards can be built with these characteristics, unless the entire packaging system is provided with the desired transmission line characteristics, the overall system is degraded and is unable to achieve the desired operating speed.

One weak area in packaging systems has been the connectors which interconnect printed circuit boards to various other portions of the system. The conventional technique used in the art for providing transmission line-like interconnections between printed circuit boards employs discrete coaxial cables which must be individually interconnected between the boards. This technique, while satisfactory from a technical point of view, leaves much to be desired from the standpoint of reliability and cost. Moreover, such interconnectors are bulky and reduce the interconnection density to an undesirably low level. Other known types of printed circuit board connectors make no special effort to maintain circuit line impedance characteristics. In other words, the connectors merely perform an interconnecting function rather than a combined interconnecting and impedance matching function.

Accordingly, it is an object of this invention to provide an improved printed circuit board connector.

It is another object of this invention to provide an impedance matched printed circuit board connector.

Yet another object of this invention is to provide an impedance matched printed circuit board connector which is inexpensive to manufacture.

Still another object of this invention is to provide an impedance matched printed circuit board interconnector with a high interconnection density.

And yet another object of this invention is to provide an impedance matched printed circuit board interconnector which makes use of printed circuit techniques for its manufacture.

In accordance with the above stated objects, a laminated impedance matched connector is provided which includes a sheet of dielectric material, on one side of which a plurality of electrical contact members are formed using conventional printed circuit techniques. On the other side of the dielectric sheet, a resilient conductive ground plane is bonded. The laminate is formed into a substantially U shaped configuration to receive the edge connectors from printed circuit boards. The distance between the electrical contact members and the resilient conductive ground plane achieves the desired impedance matching characteristic and provides a continuous transmission line characteristic from board to interconnector to board.

The foregoing and other objects, features and advantages of the invention will be apparent from the following more particular description of the preferred embodiment of the invention, as illustrated in the accompanying drawings.

Figure 5:
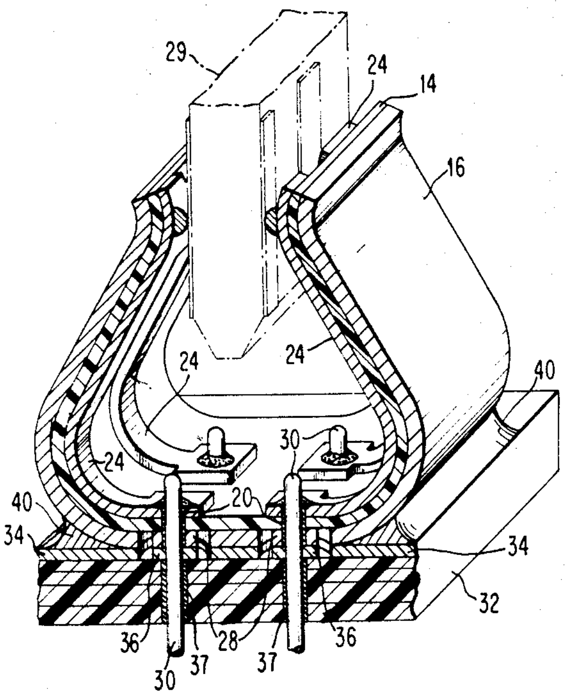

In the drawings:

FIGS. 1–5 show the various steps required to produce the invention with FIG. 5 illustrating its final configuration.

Referring now to FIG. 1, the manufacture of the impedance matched connector is commenced by providing a laminate 10. Laminate 10 comprises a sheet of conductive metal 12 which is adherent to a dielectric sheet 14. A conductive resilient metal sheet 16 is adherent to the other side of dielectric sheet 14. Sheet 12 may comprise copper or some other suitable highly conductive metal while resilient conductor 16 may be Phosphor bronze. Other suitable resilient metals are beryllium-copper, sheet brass, and stainless steel. Such materials are readily available in sheet form and may be obtained in substantially any desired thickness and/or width and length. Dielectric sheet 14 is preferably a flexible organic material such as polyethylene terephthalate or tetrafluoroethylene (Mylar and Teflon respectively—trademarks of the Du Pont Co.). It is important that the thickness of dielectric sheet 14 be relatively constant and further, that it be flexible in nature. Resilient conductor material 16 must, when formed, retain its shape and provide a spring-like characteristic. Laminate 10 may be formed by any of a number of well known lamination processes which are commercially available.

Figure 2:
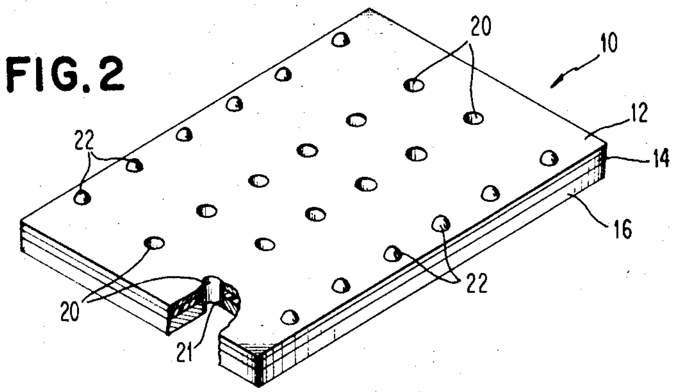

Referring now to FIG. 2, a plurality of holes 20 are drilled or otherwise produced in laminate 10 and are subsequently plated with a conductive metal 21 to form through hole conductors. Interior plating 21 of through holes 20 is readily accomplished by chemically depositing a very thin layer of a conductive metal upon the interior surfaces of holes 20 and subsequently electroplating a heavier layer of conductor metal thereover. Such processes are well known in the art and are commercially available. One such technique is described in Radovsky Patent 3,099,600 assigned to the same assignee as this application.

A connector button 22 is provided opposite each plated through hole 20. Each of connector buttons 22 provides the bearing surface and electrical interconnection between the connector and a printed circuit board when the connector is finally completed. Connector buttons 22 may be emplaced by any of a number of well-known techniques. One such technique (not shown) involves the placement of a mask over conductive sheets 12 with the mask being provided with holes at the positions where buttons 22 will finally be placed. A nickel-gold preform is then dropped into each hole in the mask and it is either thermocompression bonded or soldered into place via a pressure bonding head. An alternative technique for providing connector buttons 22 is to use conventional masking and deposition processes with the masked laminate being dipped into several plating solutions to achieve a button which is an alloy of nickel and gold.

Figure 3:
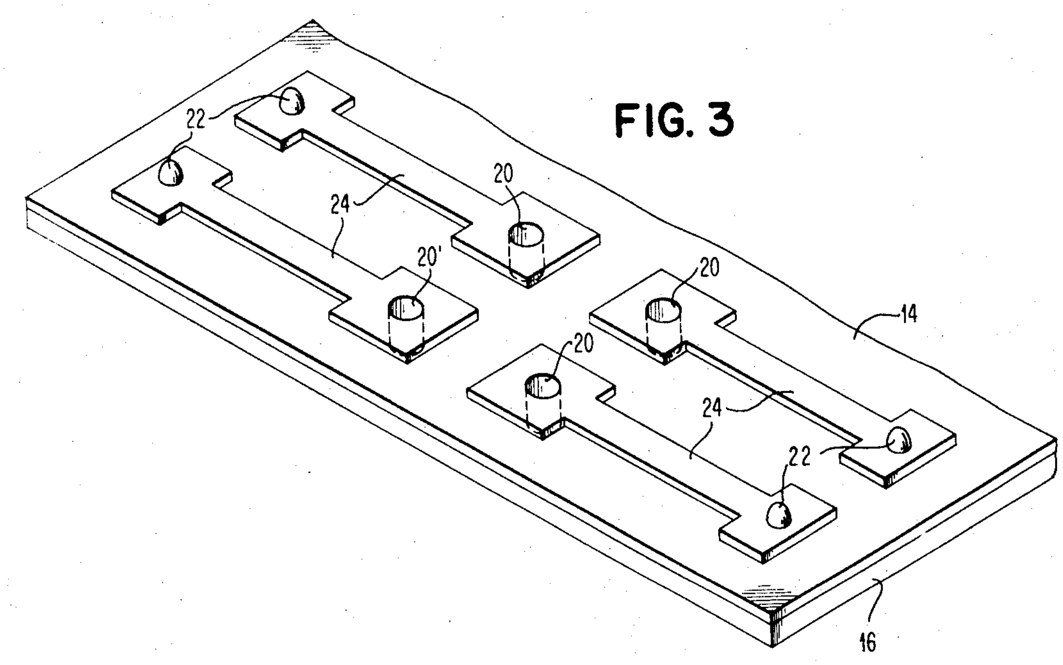
Figure 4:
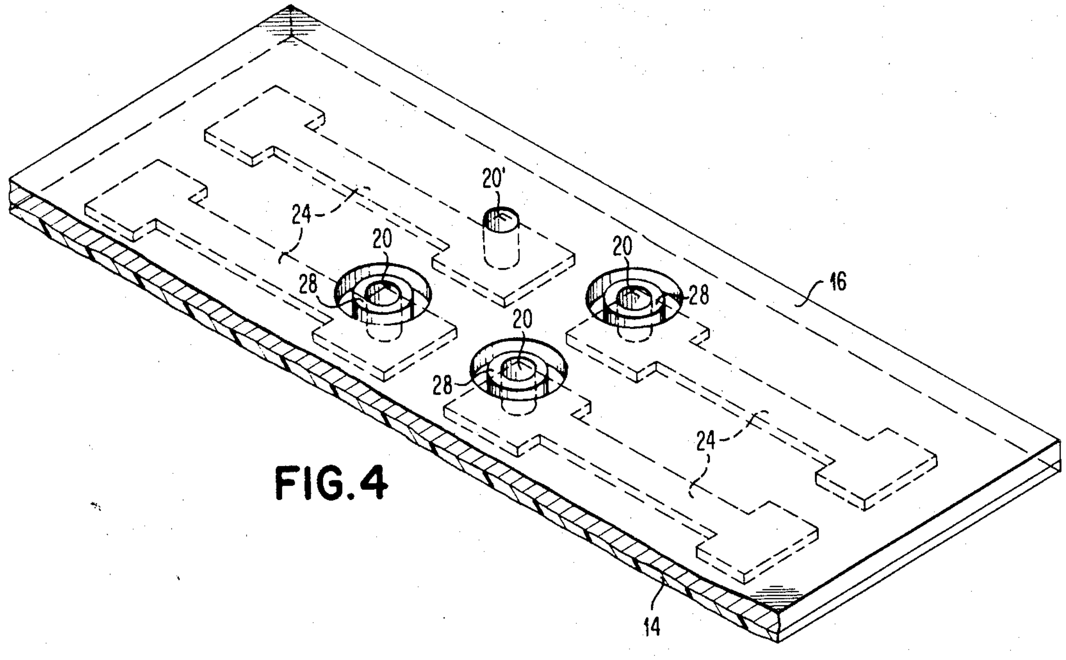

Referring now to FIG. 3, after the production of plated through holes 20 and emplacement of connector buttons 22, conductive sheet 12 is etched to provide the interconnecting land areas 24. While the specific steps of this process are not shown, they are well known and will be briefly described. An etch resist is deposited over conductive sheet 12 and is subsequently exposed through a mask to render insoluble those areas of the resist which are directly over conductive areas 24. A solvent is then applied to the resist which dissolves the unexposed resist areas readying the laminate for etching. (During this step of the process, Phosphor-bronze sheet 16 is masked). The entire sheet is then dipped into an acid etch which removes those areas of conductive sheet 12 not protected by the acid resist. After the unwanted copper areas have been etched away, the laminate is dipped into a base solution to inhibit any further etching action. The laminate is then washed, and the hardened resist removed by subjecting it to a solvent (e.g. Metex Stripper 682, available from MacDermid, Inc., Waterbury, Conn.) leaving the configuration of FIG. 3.

An identical resist-etch process to that above described is now utilized (FIG. 4) to disconnect plated through holes 20 from Phosphor bronze sheet 16. In this case, the laminate is turned over and masked to provide land areas 28 which connect to plated through holes 20. Under certain circumstances, it is desired that a plated through hole 20 connects directly to Phosphor bronze sheet 16 and in this case no such disconnection is provided, e.g. plated through hole 20'.

Upon completion of the above steps, the laminate is bent around a forming dye to produce the shape shown in FIG. 5. It is important that the thickness of Phosphor bronze sheet be sufficient to maintain a permanent set and exert sufficient pressure upon the remaining portions of the laminate to provide the desired contact pressure when a connective member or card 29 carrying conductive members is inserted between contact buttons 22. The amount of bend provided to Phosphor bronze sheet 16 is directly dependent upon the thickness of the card to be inserted and the desired contact pressure.

Once the connector has been so formed, plated through holes 20 are aligned with pins 30 which emanate from a multilayer printed circuit board 32. The upper surface of printed circuit board 32 is provided with conductive ground plane 34 and signal interconnection lands 36 which connect to plated through holes 37. Connector pins 30, ground plane conductor 34 and signal lands 36 are pretinned and ready for soldering. When the connector is aligned with pin 30 and dropped thereon, conductive signal lands 28 mate with signal lands 36 with the remaining portions of Phosphor bronze sheet 16 mating with pretinned ground plane conductor 34. By then raising the temperature of the system to the melting point of the pretinned solder, the final interconnections are produced. A solder fillet 40 may also be provided for structural rigidity purposes.

Once card 29 is inserted between connector buttons 22, a substantially continuous transmission line interconnection is formed between the card 29 and multilayer printed circuit board 32 with conductors 24 forming the signal interconnection pathways and Phosphor bronze sheet 16, a contiguous ground plane. It can thus be seen that via the use of well known printed circuit techniques, an impedance matched connector can be provided which is both inexpensive and simple to manufacture.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. An electrical connector comprising a composite structure which includes:

- a layer of flexible dielectric material,
- a plurality of electrical contact members located on one side of said layer,
- a resilient conductor bonded to the other side of said layer, and of sufficient thickness to retain its shape and provide a springlike characteristic,
- said composite structure being formed into a substantially arcuate shaped configuration to receive a connective member carrying conductive members spaced to mate with said contact members.

2. The invention as defined in claim 1 wherein said resilient conductor comprises a sheet of high conductivity spring metal.

3. The invention as defined in claim 2 wherein the forming of said composite structure creates a permanent set in said spring metal which biases said contact members towards each other.

4. The invention as defined in claim 3 wherein said spring metal is connected to a source of reference potential and the distance between said contact members and spring metal is controlled by the thickness of said dielectric material, said arrangement providing transmission line characteristics to said connector.

5. An electrical connector comprising a laminate which includes:

- a sheet of polymeric dielectric material,
- a plurality of electrical contact members formed on one side of said sheet,
- a resilient conductive spring metal bonded to the other side of said dielectric sheet,
- means connecting said spring metal to a source of reference potential,
- said laminate being bent to create a permanent set in said spring metal which positions said contact members in opposed relation, said contact members being forced apart when a connective member is inserted therebetween whose thickness is greater than the separation distance between said members; and
- means for providing an exterior electrical connection to each said contact member.

References Cited

UNITED STATES PATENTS 2,923,860 2/1960 Miller -------------- 317—101

MARVIN A. CHAMPION, *Primary Examiner.*

PATRICK A. CLIFFORD, *Assistant Examiner.*